(12) United States Patent
Li et al.

(10) Patent No.: US 9,910,598 B2
(45) Date of Patent: Mar. 6, 2018

(54) HOST INTERFACE CONTROLLER AND CONTROL METHOD FOR STORAGE DEVICE

(71) Applicant: VIA Alliance Semiconductor Co., Ltd., Shanghai (CN)

(72) Inventors: Lin Li, Beijing (CN); Yunxing Dong, Beijing (CN); Zhiqiang Hui, Beijing (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 34 days.

(21) Appl. No.: 15/160,682

(22) Filed: May 20, 2016

(65) Prior Publication Data

US 2017/0168723 A1    Jun. 15, 2017

(30) Foreign Application Priority Data

Dec. 9, 2015    (CN) .......................... 2015 1 0902677

(51) Int. Cl.
*G06F 3/06*    (2006.01)
*G06F 12/02*    (2006.01)
(Continued)

(52) U.S. Cl.
CPC ............ *G06F 3/0605* (2013.01); *G06F 3/061* (2013.01); *G06F 3/0611* (2013.01);
(Continued)

(58) Field of Classification Search
CPC ............................... G11C 7/10; G06F 12/0862
See application file for complete search history.

(56) References Cited

U.S. PATENT DOCUMENTS 5,854,911 A * 12/1998 Watkins ............. H04Q 11/0478
                                                      711/118
6,453,388 B1 * 9/2002 Gonzales .............. G06F 9/3802
                                                      711/137
(Continued)

FOREIGN PATENT DOCUMENTS

TW    200801951 A    1/2008
TW    201324150 A    6/2013
(Continued)

OTHER PUBLICATIONS

Boyd, J.A.; "Serial ATA Advanced Host Controller Interface (AHCI) 1.3.1;" Dec. 2013; pp. 1-131.
(Continued)

*Primary Examiner* — Edward J Dudek, Jr.
(74) *Attorney, Agent, or Firm* — McClure, Qualey & Rodack, LLP

(57) ABSTRACT

A host interface controller having a first buffer set and a second buffer set operated in a ping-pong buffer mode by a control module to alternately work as a pre-fetch buffer set. When one buffer set between the first buffer set and the second buffer set works as the pre-fetch buffer set, the control module pre-fetches and buffers data starting from a first address of a storage device into the pre-fetch buffer set and accesses the other buffer set between the first buffer set and the second buffer set to respond to a read request that the central processing unit issues to access data of a second address of the storage device.

16 Claims, 5 Drawing Sheets

(51) Int. Cl.
  *G06F 9/44*      (2018.01)
  *G06F 12/0862*   (2016.01)
  *G11C 11/408*    (2006.01)
  *G11C 11/4091*   (2006.01)

(52) U.S. Cl.
  CPC .......... *G06F 3/0632* (2013.01); *G06F 3/0656* (2013.01); *G06F 3/0659* (2013.01); *G06F 3/0673* (2013.01); *G06F 3/0685* (2013.01); *G06F 9/4406* (2013.01); *G06F 12/0292* (2013.01); *G06F 12/0862* (2013.01); *G11C 11/4082* (2013.01); *G11C 11/4091* (2013.01); *G06F 2212/1016* (2013.01); *G06F 2212/602* (2013.01); *G06F 2212/6022* (2013.01)

(56) References Cited

U.S. PATENT DOCUMENTS

| | | | |
|---|---|---|---|
| 6,718,441 | B2 | 4/2004 | Gonzales et al. |
| 8,862,858 | B1 | 10/2014 | Ozdemir |
| 8,996,772 | B1 | 3/2015 | Raza et al. |
| 9,053,052 | B1 | 6/2015 | Schmidt et al. |
| 2007/0297433 | A1 | 12/2007 | Lin et al. |
| 2009/0150588 | A1 | 6/2009 | Wang et al. |
| 2011/0179249 | A1 | 7/2011 | Hsiao |
| 2012/0054419 | A1 | 3/2012 | Chen et al. |
| 2012/0072674 | A1* | 3/2012 | Pierson ............... G06F 12/0862 711/137 |
| 2012/0079202 | A1* | 3/2012 | Chirca ............... G06F 12/0862 711/122 |
| 2013/0167130 | A1* | 6/2013 | Alvanos ............... G06F 9/4436 717/160 |
| 2014/0195564 | A1 | 7/2014 | Talagala et al. |
| 2014/0351675 | A1 | 11/2014 | Tiziani et al. |
| 2015/0082000 | A1* | 3/2015 | Hong ................. G06F 12/1009 711/205 |
| 2015/0339064 | A1 | 11/2015 | Feng et al. |
| 2017/0161191 | A1 | 6/2017 | Cohen et al. |

FOREIGN PATENT DOCUMENTS

| | | |
|---|---|---|
| TW | 201403605 A | 1/2014 |
| TW | I421769 B | 1/2014 |

OTHER PUBLICATIONS

"NVM Express 1.2;" NVM Express, Inc.; Nov. 2014; pp. 1-205.
"NVM Express Management Interface 1.0;" NVM Express, Inc.; Nov. 2015; pp. 1-96.

* cited by examiner

HOST INTERFACE CONTROLLER AND CONTROL METHOD FOR STORAGE DEVICE

CROSS REFERENCE TO RELATED APPLICATIONS

This application claims priority of China Patent Application No. 201510902677.9, filed on Dec. 9, 2015, the entirety of which is incorporated by reference herein.

BACKGROUND OF THE INVENTION

Field of the Invention

The present invention relates to a host interface controller, and in particular relates to a host interface controller that is coupled to a central processing unit and retrieves data from a storage device.

Description of the Related Art

A storage device may be connected to a host via a communication interface. A host interface controller corresponding to the communication interface is required on the host side, which is operated by a central processing unit of the host for data access of the storage device via the communication interface.

BRIEF SUMMARY OF THE INVENTION

A host interface controller in accordance with an exemplary embodiment of the disclosure has a control module, a first buffer set and a second buffer set. The control module operates the first buffer set and the second buffer set in a ping-pong buffer mode to alternately work as a pre-fetch buffer set. When one of the first buffer set and the second buffer set works as the pre-fetch buffer set, the control module pre-fetches and buffers data starting from a first address of a storage device into the pre-fetch buffer set and accesses the other one of the first buffer set and the second buffer set to respond to a read request that the central processing unit issues to access data of a second address of the storage device. More than one read requests of sequential addresses are issued from the central processing unit.

A control method for a storage device in accordance with an exemplary embodiment of the disclosure comprises the following steps: providing a first buffer set and a second buffer set within a host interface controller between a storage device and a central processing unit; operating the first buffer set and the second buffer set in a ping-pong buffer mode to alternately work as a pre-fetch buffer set; and when one of the first buffer set and the second buffer set works as the pre-fetch buffer set, pre-fetching and buffering data starting from a first address of the storage device into the pre-fetch buffer set and accessing the other one of the first buffer set and the second buffer set to respond to a read request that the central processing unit issues to access data of a second address of the storage device. More than one read requests of sequential addresses are issued from the central processing unit.

The first and second buffer sets operating in the ping-pong buffer mode continuously pre-fetch data of sequential addresses from the storage device and buffer it in the first and second buffer sets to smoothly respond to the read requests of sequential addresses issued from the central processing unit.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

Figure 1:
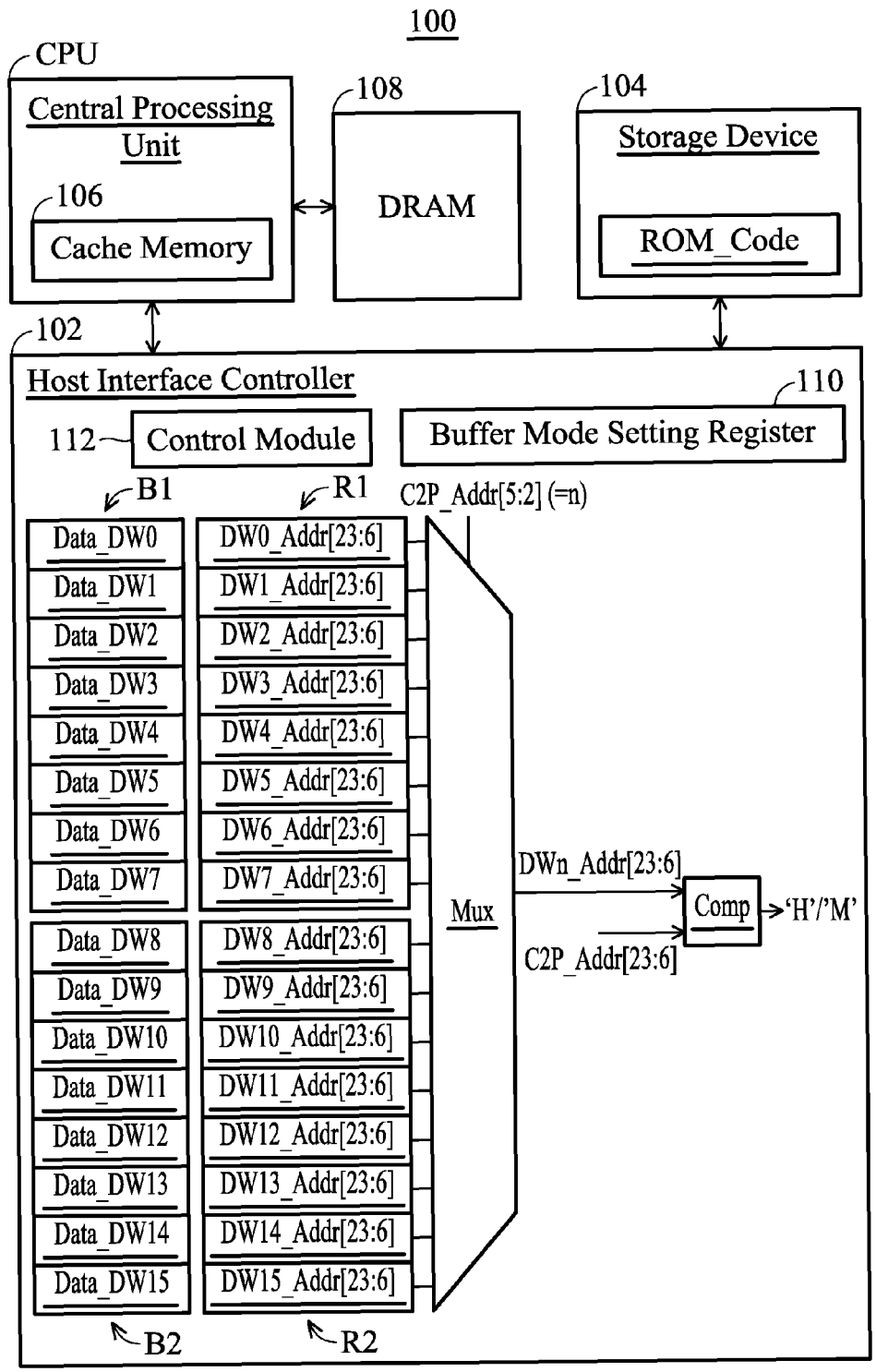
FIG. 1 depicts a computer system 100 in accordance with an exemplary embodiment of the disclosure.

FIG. 1 depicts a computer system 100 in accordance with an exemplary embodiment of the disclosure, which includes a central processing unit CPU, a host interface controller 102 and a storage device 104. The central processing unit CPU comprises a cache memory (which is a high-speed buffer) 106 and is further coupled to a dynamic random access memory (DRAM) 108. The storage device 104 stores read-only memory code ROM_Code. The host interface controller 102 includes a control module 112, a buffer mode setting register 110, a first buffer set B1, a second buffer set B2, a first register set R1, a second register set R2, a multiplexer Mux and a comparator Comp.

The first buffer set B1 and the second buffer set B2 are provided to reduce the system load caused by the host interface controller 102 that frequently outputs commands for data of the storage device 104. In an exemplary embodiment, the communication interface is a serial peripheral interface (SPI), and the corresponding host interface controller 102 has to output a read command consisting of one byte and a read address consisting of three bytes to read one batch of data from the storage device 104. The data length of the batch of data read from the storage device 104 is controlled by the host interface controller 102. Following the read command issued by the host interface controller 102 to read data from the storage device 104, the read address consisting of three bytes only indicates a start address but is silent about the end address. The host interface controller 102 may decide the end address itself. In this disclosure, because of the first buffer set B1 and the second buffer set B2 being provided within the host interface controller 102, the batch of data that the host interface controller 102 read from the storage device 104 may be a large amount of data and is not limited to the data length requested in the read request issued from the central processing unit CPU. Thus, the host interface controller 102 does not need to frequently output read commands to read the storage device 104. A large amount of data of the storage device 104 is pre-fetched and buffered in the first and the second buffer sets B1 and B2 by the host interface controller 102 to respond to the read requests issued from the central processing unit CPU.

Corresponding to the first buffer set B1 and the second buffer set B2, the first register set R1, the second register set R2, the multiplexer Mux and the comparator Comp are provided to check whether the data of the storage device 104 requested by the central processing unit CPU has been pre-fetched and buffered in the first or second buffer set B1 or B2.

Note that, during the start-up procedure, the control module 112 adaptively switches the operation mode of the first and second buffer sets B1 and B2 depending on what data of the storage device 104 is requested by the central processing unit CPU. The operation mode of the first and second buffer sets B1 and B2 is set through the buffer mode setting register 110. It is not intended to limit the disclosure to the start-up procedure. Once the storage device 104 is accessed in several stages with various levels of read address continuity, the operation mode of the first and second buffer sets B1 and B2 may be adaptively changed in accordance with the techniques of the disclosure.

During a start-up procedure, the central processing unit CPU operates in three stages. In the first stage, the cache memory 106 and the DRAM 108 have not started up. The central processing unit CPU frequently repeats reading the read-only memory code ROM_Code of specific addresses. Because the cache memory 106 has not started up, in response to the read requests from the central processing unit CPU, a conventional host interface controller has to repeatedly output read commands of the same addresses to read the storage device 104, which results in low efficiency. In the second stage, the cache memory 106 has started up and the central processing unit CPU issues mostly read requests of sequential addresses. In the third stage, the DRAM 108 has also started up, the central processing unit CPU requests to move the read-only memory code ROM_Code to the DRAM 108 in bulk. Because the central processing unit CPU is outputting read requests of contiguous and non-repeated read addresses in the third stage, the data stored in the cache memory 106 usually does not hit the read requests from the central processing unit CPU. A conventional host interface controller has to output read commands separately for every read request issued from the central processing unit CPU. For example, a conventional SPI controller has to output one read command consisting of one byte and a read address consisting of three bytes to access the storage device 104 for every read request. In summary, the read requests usually request data of repeated addresses before the cache memory 106 starts up and, after the cache memory 106 starts up, the read requests mostly request to read data of sequential addresses.

During the start-up procedure, the buffer mode setting register 110 is set according to whether the cache memory 106 of the central processing unit CPU has started up or not. In the first stage which is before the cache memory 106 starts up, the first and second buffer sets B1 and B2 operate in a cache memory mode to cope with the repeated read requests that the central processing unit CPU issues to access the same data from the storage device 104. In the second and third stages (or just the third stage) which are after the cache memory 106 starts up, the first and second buffer sets B1 and B2 operate in a ping-pong buffer mode to cope with the sequential read requests issued from the central processing unit CPU to access data of continuous addresses. In the cache memory mode, the control module 112 uses the first buffer set B1 and the second buffer set B2 to cache the data which is read from the storage device 104 in a data length of several line buffers of the first and second buffer sets B1 and B2. Referring to FIG. 1, the first buffer set B1 and the second buffer set B2 each comprise eight line buffers. As shown, the first buffer set B1 includes line buffers Data_DW0 to Data_DW7, the second buffer set B2 includes line buffers Data_DW8 to Data_DW15. In this example, the size of each line buffer is four bytes and the size of the first and second buffer sets B1 and B2 is 64 bytes because the address range to be repeatedly read is about 64 bytes during the first stage of the start-up procedure. The central processing unit CPU outputs read requests each requesting for read data of four bytes, for example, but it is not limited thereto. In the cache memory mode of the exemplary embodiment, the data length requested by each read command that the control module 112 issues to read the storage device 104 has not to be limited to four bytes and may be in the size of multiple line buffers of the first and second buffer sets B1 and B2. For example, the data length requested by a read command that the control module 112 issues to read the storage device 104 may be four bytes, or eight bytes, or 16 bytes. A register (not shown) may be provided within the host interface controller 102 to set the data length requested by each read command of the host interface controller 102. There is no need to frequently output read instructions (including a read command consisting of one byte and a read address consisting of three bytes) to access the storage device 104. Instead, multiple line buffers of data may be read from the storage device 104 at a time. In the ping-pong buffer mode, the control module 112 alternately uses the first buffer set B1 and the second buffer set B2 as a pre-fetch buffer set to buffer the sequential data pre-fetched from the storage device 104. For example, when one buffer set between the first buffer set B1 and the second buffer set B2 plays the role of a pre-fetch buffer set, the control module 112 pre-fetches and buffers sequential data starting from the first address of the storage device 104 into the pre-fetch buffer set, and uses the data stored in the other buffer set between the first buffer set and the second buffer set B1 and B2 to respond to a read request that the central processing unit CPU issues to access data of a second address of the storage device 104. It is noted that the data stored in the other buffer set between B1 and B2 are data previously pre-fetched and buffered by the other buffer set when it played the role of the pre-fetch buffer set previously. In an exemplary embodiment, the rule to select the pre-fetch buffer set comprises: when sequentially reading to the first line buffer Data DW8 of the second buffer set B2, switching to use the first buffer set B1 as the pre-fetch buffer set to buffer the data that is pre-fetched from the storage device 104 from an address sequential to the address of the data buffered in the last line buffer Data_DW15 of the second buffer set B2; and when the sequential reading going to the first line buffer Data_DW0 of the first buffer set B 1, switching to use the second buffer set B2 as the pre-fetch buffer set to buffer the data that is pre-fetched from the storage device 104 from an address sequential to the address of the data buffered in the last line buffer Data_DW7 of the first buffer set B 1. A sequential read operation means that the central processing unit CPU is requesting to read an address sequential or continuous to the address requested by a previous read request. In some exemplary embodiments, when operating the buffer sets B1 and B2 in the ping-pong buffer mode, the data length read from the storage device 104 every time the control module 112 issues a read command to access the storage device 104 is controlled by the control module 112 itself. For example, when it is required to terminate the pre-fetching operation, the control module 112 ends pre-fetching and buffering data into the pre-fetch buffer set itself without depending on the any register (but it is not limited thereto).

In this paragraph, the operations of the first register set R1, the second register set R2, the multiplexer Mux and the comparator Comp are discussed. In an exemplary, non-limiting embodiment, the central processing unit CPU outputs each read request (e.g. each C2P request) with a read address C2P_Addr[23:0] of 24 bits to read data of four addresses (e.g. to read four bytes of data). Corresponding to the first buffer set B1, the first register set R1 stores address information DW0_Addr[23:6] to DW7_Addr[23:6] (e.g. the high address bits) about the data Data_DW0 to Data_DW7 stored in the first buffer set B1. Corresponding to the second buffer set B2, the second register set R2 stores address information DW8_Addr[23:6] to DW15 Addr[23:6] (e.g. the high address bits) about the data Data_DW8 to Data_DW15 stored in the second buffer set B2. The first and second buffer sets B1 and B2 form a table indexed by the low address bits DW0_Addr[5:2] to DW15_Addr[5:2] of the data Data_DW0 to Data_DW15 stored in the first and second buffer sets B1 and B2. Regarding the low address bits C2P_Addr[5:2] requested in the read request issued from the central processing unit CPU as a target index n, the multiplexer Mux outputs reference high address bits DWn_Addr[23:6] selected from the first and second register sets R1 and R2. The comparator Comp compares the reference high address bits DWn_Addr[23:6] with the high address bits C2P_Addr[23:6] of the read address. When the reference high address bits DWn_Addr[23:6] match the high address bits C2P_Addr[23:6] of the read address, the comparator Comp outputs 'H' to represent that the data requested by the central processing unit CPU has been pre-fetched and buffered in the first or second buffer set B1 or B2. When the reference high address bits DWn_Addr[23:6] do not match the high address bits C2P_Addr[23:6] of the read address, the comparator Comp outputs 'M' to represent that the data requested by the central processing unit CPU has not been pre-fetched and buffered in the first or second buffer set B1 or B2. When the data of the read address requested by the central processing unit CPU has been pre-fetched and buffered in the first or second buffer set B1 or B2, the control module 112 returns the line of data pre-fetched and buffered in the first and second buffer sets B1 and B2 according to the target index n (i.e. C2P_Addr[5:2]) to respond the central processing unit CPU.

Figure 2:
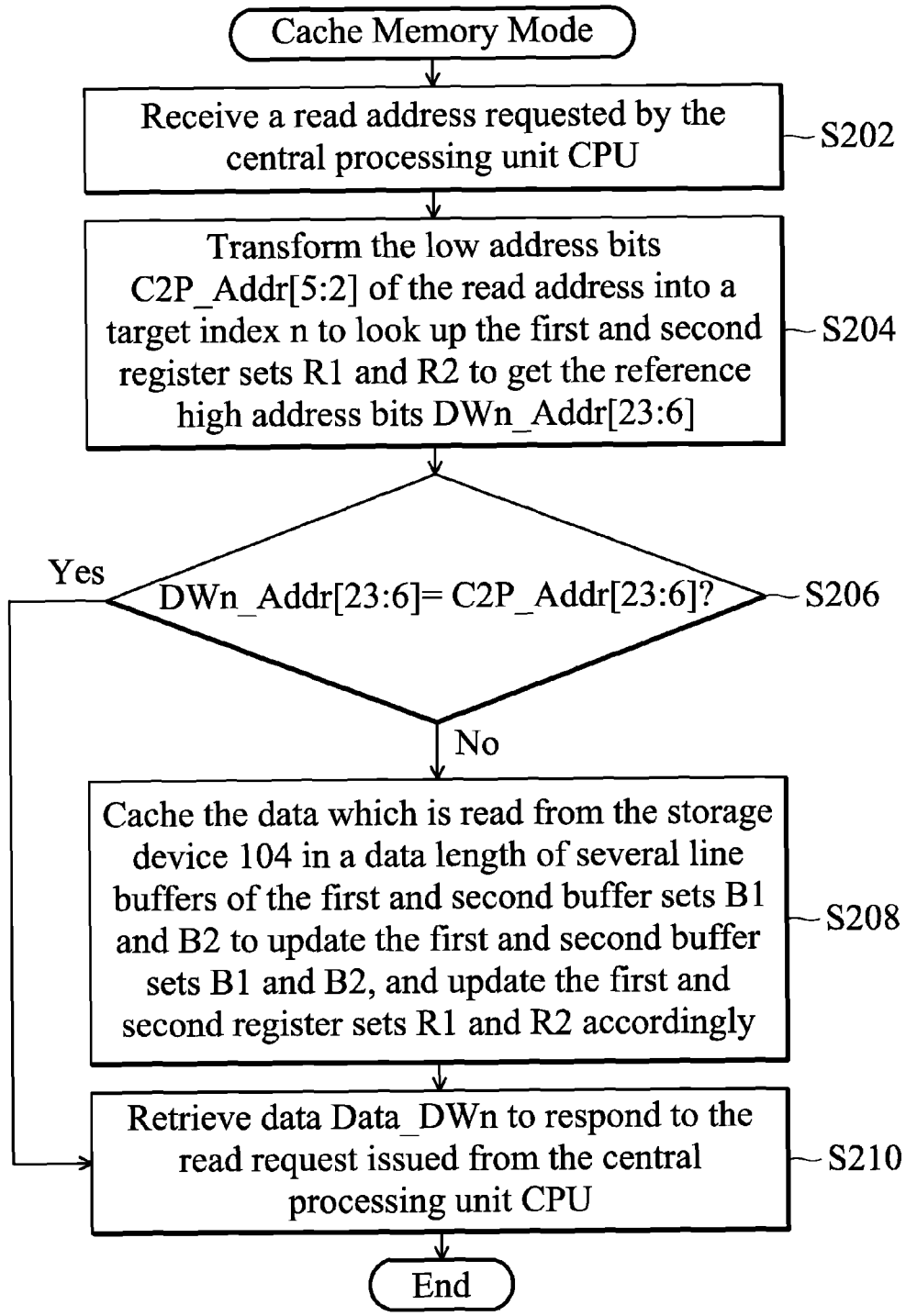
FIG. 2 is a flowchart depicting how the first and second buffer sets B1 and B2 operated in the cache memory buffer mode work when the central processing unit CPU outputs a read request.

FIG. 2 is a flowchart depicting how the first and second buffer sets B1 and B2 operated in the cache memory buffer mode work when the central processing unit CPU outputs a read request. In step S202, a read address C2P_Addr[23:0] requested by the central processing unit CPU is received. In step S204, the low address bits C2P_Addr[5:2] of the read address C2P_Addr[23:0] are transformed into a target index n to look up the first and second register sets R1 and R2 to get the reference high address bits DWn_Addr[23:6]. In step S206, it is checked whether the reference high address bits DWn_Addr[23:6] match the high address bits C2P_Addr [23:6]. If not, step S208 is performed to cache the data which is read from the storage device 104 in a data length of several line buffers of the first and second buffer sets B1 and B2 to update the first and second buffer sets B1 and B2 and, accordingly, the address information in the first and second register sets R1 and R2 are updated. In step S210, data Data_DWn is retrieved from the updated first and second buffer sets B1 and B2 according to the target index n to respond to the read request issued from the central processing unit CPU. Step S210 is not limited to being performed to respond to the central processing unit CPU after step S208 finishes all the pre-fetching and buffering operations. In another exemplary embodiment, the central processing unit CPU is immediately responded to once the data (i.e. 4 bytes of data) requested by the central processing unit CPU has been read from the storage device 104. When it is determined in step S206 that the reference high address bits DWn_Addr[23:6] match the high address bits C2P_addr[23:6], it means that the data requested by the central processing unit CPU has already been pre-fetched and buffered into the first or second buffer sets B1 or B2. Thus, step S210 is performed and step S208 is bypassed. In step S210, data Data_DWn is retrieved from the first and second buffer sets B1 and B2 according to the target index n to respond to the read request issued from the central processing unit CPU.

Figure 3A:
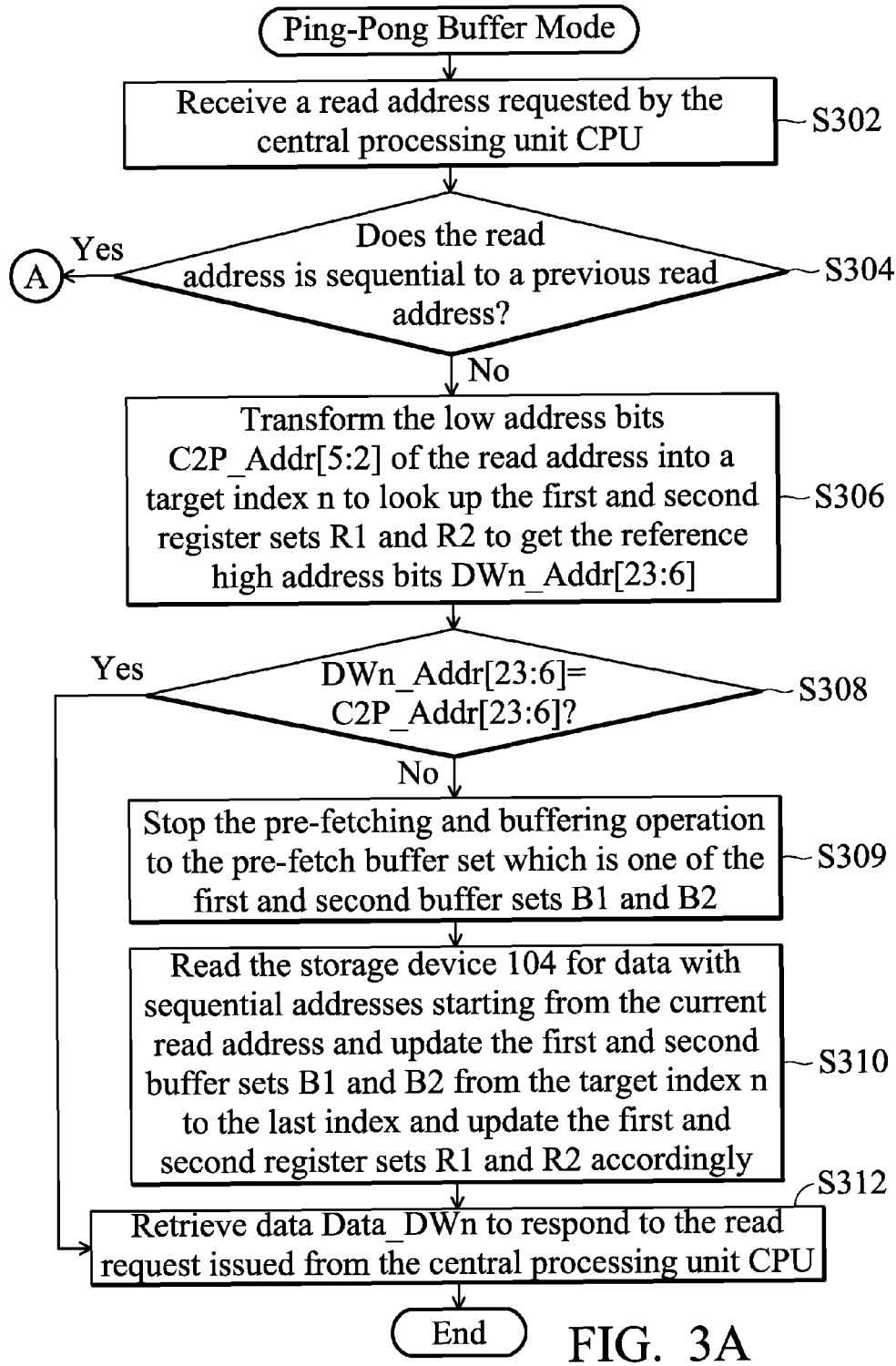
FIG. 3A and FIG. 3B show a flowchart depicting how the first and second buffer sets B1 and B2 operated in the ping-pong buffer mode work when the central processing unit CPU outputs a read request.
Figure 3B:
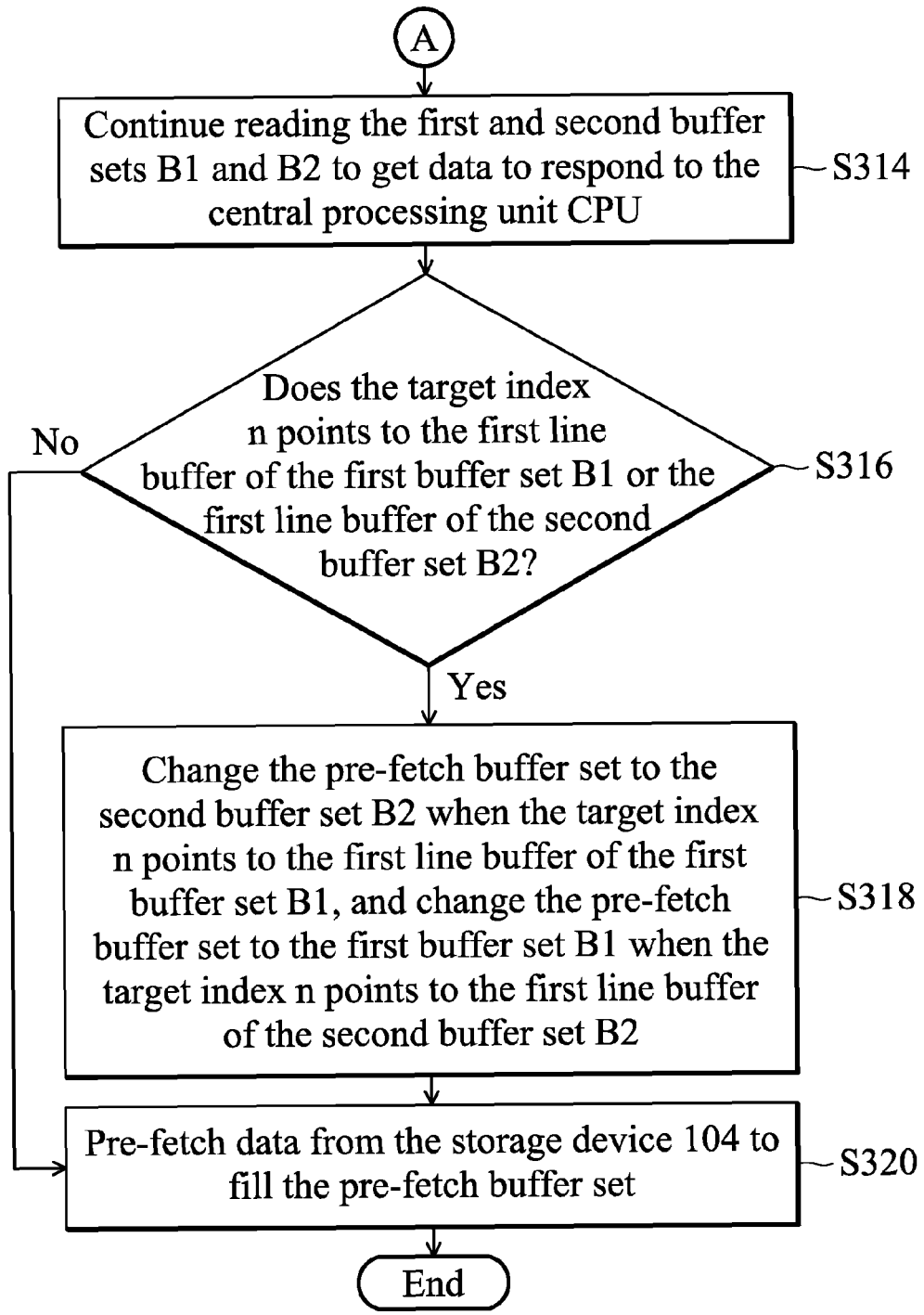

FIG. 3A and FIG. 3B show a flowchart depicting how the first and second buffer sets B1 and B2 operated in the ping-pong buffer mode work when the central processing unit CPU outputs a read request. In step S302, a read address requested by the central processing unit CPU is received. In step S304, it is determined whether the read address is sequential to a previous read address issued from the central processing unit CPU. If not, step S306 is performed to transform the low address bits C2P_Addr[5:2] of the read address into a target index n to look up the first and second register sets R1 and R2 to get the reference high address bits DWn_Addr[23:6]. In step S308, it is checked whether the reference high address bits DWn_Addr[23:6] match the high address bits C2P_Addr[23:6] of the read address. If not, it means that the data of the read address C2P_Addr[23:0] has not been pre-fetched in the first and second buffer sets B1 and B2 and step S309 is performed, and thereby the pre-fetching and buffering operation to the pre-fetch buffer set, which is one of the first and second buffer sets B1 and B2, is stopped. When the first and second buffer sets B1 and B2 operate in the ping-pong buffer mode and the requested read address is determined not to be sequential to the previous read address in step S304 and the reference high address bits DWn_Addr[23:6] are determined to not be matching the high address bits C2P_Addr[23:6] of the read address in step S308, it means that the read request from the central processing unit CPU has probably already jumped to another address sector, at which the data has not be pre-fetched or buffered. Thus, it is meaningless to continue pre-fetching and buffering data around the address range of the current pre-fetch buffer set. In the disclosure, the pre-fetching and buffering operation to the pre-fetch buffer set, which is one of the first and second buffer sets B1 and B2, is stopped and step S310 is performed to read the storage device 104 for data with sequential addresses starting from the current read address C2P_Addr[23:2] and to update the first and second buffer sets B1 and B2 from the target index n corresponding to the low address bits C2P_Addr[5:2] of the current read address C2P_Addr[23:2] to the last index of the first and second buffer sets B1 and B2 (e.g. updating Data_DWn to Data_DW15). The first and second register sets R1 and R2 are updated with the update of the first and second buffer sets B1 and B2. In step S312, the first and second buffer sets B1 and B2 are read according to the target index n to provide the data Data_DWn to respond to the read request from the central processing unit CPU. Step S312 is not limited to being performed to respond to the central processing unit CPU after step S310 finishes all the pre-fetching and buffering operations. In another exemplary embodiment, the central processing unit CPU is immediately responded once the data (i.e. 4 bytes of data) requested by the current read request issued from the central processing unit CPU has been read from the storage device 104. When it is determined in step S308 that the reference high address bits DWn_Addr[23:6] match the high address bits C2P_addr[23:6] of the read address, it means that the data requested by the central processing unit CPU has already been pre-fetched and buffered in the first or second buffer set B1 or B2 and the step S312 is performed and steps S309 and S310 are bypassed. In step S312, data Data_DWn is retrieved from the first and second buffer sets B1 and B2 according to the target index n to respond to the read request issued from the central processing unit CPU. In another case wherein the current read request is not sequential to the previous read request but the reference high address bits DWn_Addr[23:6] match the high address bits C2P_addr[23:6] of the read address, step S309 is also performed to and thereby the pre-fetching and buffering operation to the pre-fetch buffer set, which is one of the first and second buffer sets B1 and B2 is stopped. After step S309, data is pre-fetched from the storage device 104 from address C2P_addr[23:2]+1. When it is determined in step S304 that the read address is sequential to the previous read address, step S314 of FIG. 3B is performed to continue reading the first and second buffer sets B1 and B2 to get data to respond to the central processing unit CPU, to take advantage of a ping-pong buffering technique which continuously pre-fetched and buffers data of sequential addresses from the storage device 104 into the first and second buffer sets B1 and B2. In step S316, it is checked whether the target index n transformed from the read address points to the first line buffer of the first buffer set B1 or the first line buffer of the second buffer set B2. When the target index n points to the first line buffer of the first buffer set B1, the pre-fetch buffer set is changed to the second buffer set B2 in step S318. When the target index n points to the first line buffer of the second buffer set B2, the pre-fetch buffer set is changed to the first buffer set B1 in step S318. After step S318, step S320 is performed to pre-fetch data from the storage device 104 to fill the pre-fetch buffer set. When the target index n points to neither the first line buffer of the first buffer set B1 nor the first line buffer of the second buffer set B2, the pre-fetch buffer set is not changed between the first buffer set B1 and the second buffer set B2 and data is continuously pre-fetched from the storage device 104 till the current pre-fetch buffer set is full.

Figure 4:
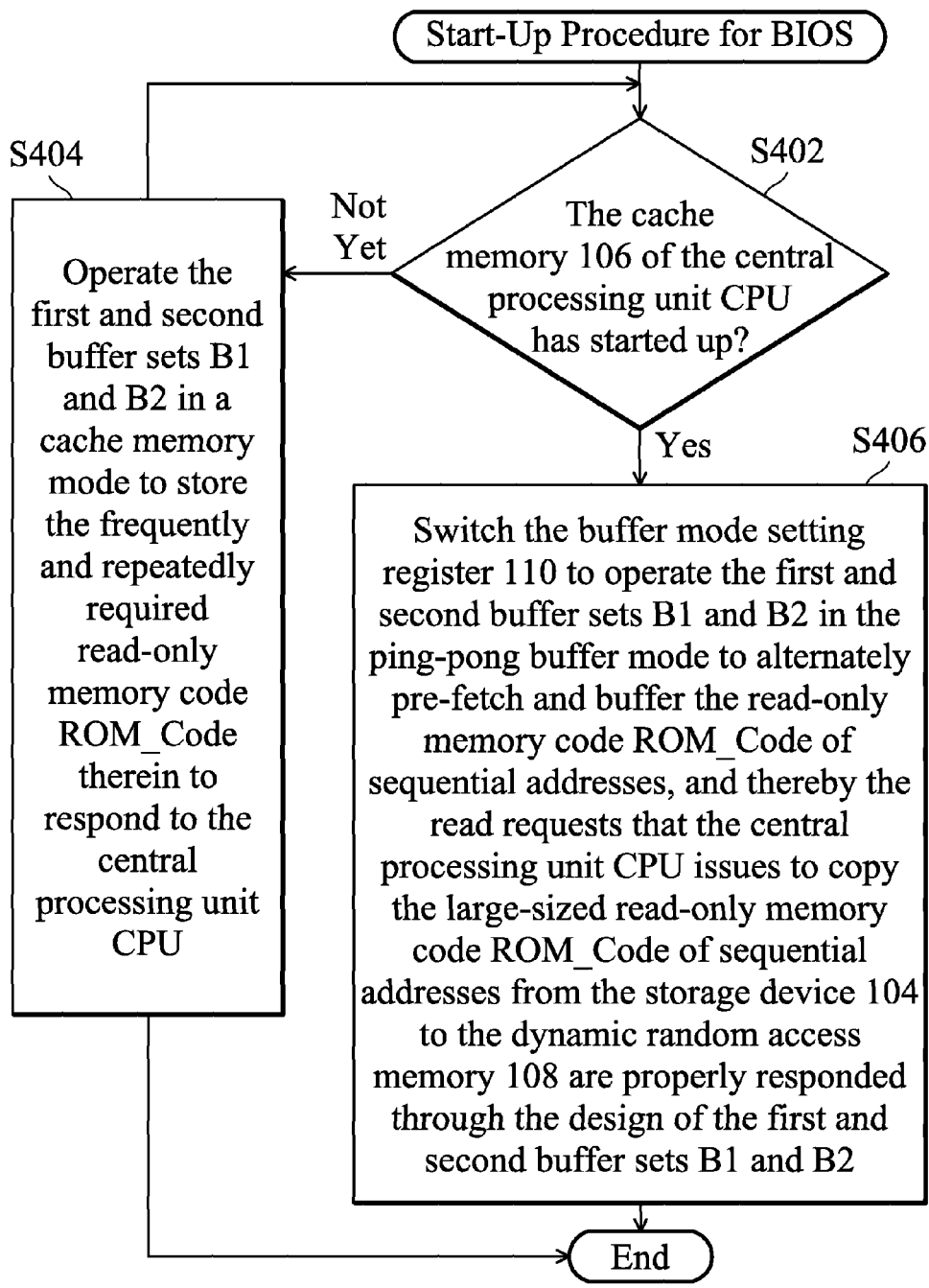
FIG. 4 is a flowchart depicting how the operation mode of the first and second buffer sets B1 and B2 is switched during the start-up procedure of the computer system 100.

FIG. 4 is a flowchart depicting how the operation mode of the first and second buffer sets B1 and B2 is switched during the start-up procedure of the computer system 100. During the start-up procedure, the read-only memory code ROM_Code stored in the storage device 104 is executed to start the BIOS. In step S402, it is checked whether the cache memory 106 of the central processing unit CPU has started up. When the cache memory 106 has not started up, step S404 is performed to operate the first and second buffer sets B1 and B2 in a cache memory mode (referring to those described in FIG. 2) to store the frequently and repeatedly required read-only memory code ROM_Code therein to respond to the central processing unit CPU. When the cache memory 106 has started up, step S406 is performed to switch the buffer mode setting register 110 to operate the first and second buffer sets B1 and B2 in the ping-pong buffer mode (referring to those described in FIG. 3A and FIG. 3B) to alternately pre-fetch and buffer the read-only memory code ROM_Code of sequential addresses. In this manner, the read requests that the central processing unit CPU issues to copy the large-sized read-only memory code ROM_Code of sequential addresses from the storage device 104 to the DRAM 108 are properly responded to through the design of the first and second buffer sets B1 and B2.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A host interface controller, coupled to a central processing unit, comprising:
   a control module;
   a first buffer set; and
   a second buffer set,
   wherein:
   the control module operates the first buffer set and the second buffer set in a ping-pong buffer mode to alternately work as a pre-fetch buffer set;
   when one of the first buffer set and the second buffer set works as the pre-fetch buffer set, the control module pre-fetches and buffers data starting from a first address of a storage device into the pre-fetch buffer set and accesses the other one of the first buffer set and the second buffer set to respond to a read request that the central processing unit issues to access data of a second address of the storage device;
   wherein more than one read requests of sequential addresses are issued from the central processing unit; and
   when the second address is not sequential to a previous read address issued from the central processing unit and the data of the second address of the storage device has not been pre-fetched and buffered in the first and second buffer sets, the control module directly reads the storage device to respond to the read request that the central processing unit issues to access data of the second address.

2. The host interface controller as claimed in claim 1, further comprising:
   a first register set, corresponding to the first buffer set and storing address information about data buffered in the first buffer set; and
   a second register set, corresponding to the second buffer set and storing address information about data buffered in the second buffer set.

3. The host interface controller as claimed in claim 2, wherein:
   the first register set stores high address bits of data buffered in the first buffer set;
   the second register set stores high address bits of data buffered in the second buffer set; and
   the first register set and the second register set form a table indexed by low address bits of the corresponding data stored in the first buffer set and the second buffer set.

4. The host interface controller as claimed in claim 2, further comprising:
   a multiplexer, retrieving the first and second register sets according to a target index to output reference high address bits, wherein the target index is transformed from low address bits of the second address; and
   a comparator, comparing the reference high address bits with high address bits of the second address to determine whether the data of the second address of the storage device has been pre-fetched and buffered in the first or the second buffer set, wherein, when the data of the second address of the storage device has been pre-fetched and buffered in the first or the second buffer set, the control module retrieves the first and second buffer sets according to the target index to provide data to respond to the read request that the central processing unit issues to access data of the second address.

5. The host interface controller as claimed in claim 1, wherein, when the second address is not sequential to a previous read address issued from the central processing unit and the data of the second address of the storage device has not been pre-fetched and buffered in the first and second buffer sets, the control module stops pre-fetching and buffering the data starting from the first address of the storage device into the pre-fetch buffer set.

6. The host interface controller as claimed in claim 1, wherein, when the second address is not sequential to a previous read address issued from the central processing unit and the data of the second address of the storage device has not been pre-fetched and buffered in the first and second buffer sets, the control module reads the storage device for data with sequential addresses starting from the second address and uses the data read from the storage device with the sequential addresses starting from the second address to update the first and second buffer sets from a target index transformed from the second address to a last index of the first and second buffer sets.

7. The host interface controller as claimed in claim 1, wherein:
when the second address is sequential to a previous read address issued from the central processing unit, the control module further determines whether a target index transformed from the second address points to a first line buffer of the first buffer set or a first line buffer of the second buffer set;
when the target index points to the first line buffer of the first buffer set, the control module switches to operate the second buffer set as the pre-fetch buffer set; and
when the target index points to the first line buffer of the second buffer set, the control module switches to operate the first buffer set as the pre-fetch buffer set.

8. The host interface controller as claimed in claim 1, wherein the host interface controller pre-fetches data from the storage device via a communication interface while a data length of the pre-fetched data is controlled by the host interface controller itself.

9. A control method for a storage device, comprising:
providing a first buffer set and a second buffer set within a host interface controller between a storage device and a central processing unit;
operating the first buffer set and the second buffer set in a ping-pong buffer mode to alternately work as a pre-fetch buffer set;
when one of the first buffer set and the second buffer set works as the pre-fetch buffer set, pre-fetching and buffering data starting from a first address of the storage device into the pre-fetch buffer set and accessing the other one of the first buffer set and the second buffer set to respond to a read request that the central processing unit issues to access data of a second address of the storage device, wherein more than one read requests of sequential addresses are issued from the central processing unit; and
when the second address is not sequential to a previous read address issued from the central processing unit and the data of the second address of the storage device has not been pre-fetched and buffered in the first and second buffer sets, reading the storage device directly to respond to the read request that the central processing unit issues to access data of the second address.

10. The control method as claimed in claim 9, further comprising:
providing a first register set corresponding to the first buffer set to store address information about data buffered in the first buffer set; and
providing a second register set corresponding to the second buffer set to store address information about data buffered in the second buffer set.

11. The control method as claimed in claim 10, wherein:
the first register set stores high address bits of data buffered in the first buffer set;
the second register set stores high address bits of data buffered in the second buffer set; and
the first register set and the second register set form a table indexed by low address bits of the corresponding data stored in the first buffer set and the second buffer set.

12. The control method as claimed in claim 10, further comprising:
retrieving the first register set and the second register set according to a target index to output reference high address bits, wherein the target index is transformed from low address bits of the second address; and
comparing the reference high address bits with high address bits of the second address to determine whether the data of the second address of the storage device has been pre-fetched and buffered in the first or the second buffer set; and
when the data of the second address of the storage device has been pre-fetched and buffered in the first or the second buffer set, retrieving the first and second buffer sets according to the target index to provide data to respond to the read request that the central processing unit issues to access data of the second address.

13. The control method as claimed in claim 9, further comprising:
when the second address is not sequential to a previous read address issued from the central processing unit and the data of the second address of the storage device has not been pre-fetched and buffered in the first and second buffer sets, stopping pre-fetching and buffering the data starting from the first address of the storage device into the pre-fetch buffer set.

14. The control method as claimed in claim 9, further comprising:
when the second address is not sequential to a previous read address issued from the central processing unit and the data of the second address of the storage device has not been pre-fetched and buffered in the first and second buffer sets, reading the storage device for data with sequential addresses starting from the second address and using the data read from the storage device with the sequential addresses starting from the second address to update the first and second buffer sets from a target index transformed from the second address to a last index of the first and second buffer sets.

15. The control method as claimed in claim 9, further comprising:
when the second address is sequential to a previous read address issued from the central processing unit, further determining whether a target index transformed from the second address points to a first line buffer of the first buffer set or a first line buffer of the second buffer set;

when the target index points to the first line buffer of the first buffer set, switching to operate the second buffer set as the pre-fetch buffer set; and when the target index points to the first line buffer of the second buffer set, switching to operate the first buffer set as the pre-fetch buffer set.

16. The control method as claimed in claim 9, wherein pre-fetching data from the storage device via a communication interface while a data length of the pre-fetched data is controlled by the host interface controller itself.

* * * * *